(12) United States Patent
Kim et al.

(10) Patent No.: US 12,074,011 B2
(45) Date of Patent: Aug. 27, 2024

(54) APPARATUS FOR AND METHOD OF MANUFACTURING SEMICONDUCTOR DEVICE

(71) Applicant: SAMSUNG ELECTRONICS CO., LTD., Suwon-si (KR)

(72) Inventors: Jiye Kim, Suwon-si (KR); In Cheol Song, Hwaseong-si (KR); Woongpil Jeon, Jeju-si (KR); Daihong Kim, Suwon-si (KR); Jaebeom Park, Yongin-si (KR); Byungho Chun, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 486 days.

(21) Appl. No.: 17/356,998

(22) Filed: Jun. 24, 2021

(65) Prior Publication Data
US 2022/0157566 A1      May 19, 2022

(30) Foreign Application Priority Data

Nov. 19, 2020  (KR) ........................ 10-2020-0155349

(51) Int. Cl.
*H01J 37/32*     (2006.01)
*C23C 16/505*    (2006.01)
*H05K 9/00*      (2006.01)

(52) U.S. Cl.
CPC ...... *H01J 37/32449* (2013.01); *C23C 16/505* (2013.01); *H01J 37/32082* (2013.01); *H05K 9/0081* (2013.01); *H01J 2237/3321* (2013.01)

(58) Field of Classification Search
CPC ........... H01J 37/32449; H01J 37/32082; H01J 2237/3321; H01J 37/32651; H01J 37/32174; H01J 37/3244; H01J 2237/3341; C23C 16/505; C23C 16/45517; C23C 16/45565; C23C 16/45591; C23C 16/54; C23C 16/45551; C23C 16/545; C23C 16/4412; C23C 14/568; C23C 16/4401; H05K 9/0081; H01L 21/6719;

(Continued)

(56) References Cited

U.S. PATENT DOCUMENTS 5,737,175  A  *  4/1998  Grosshart ........... H01L 21/6833
                                                361/234
8,366,829  B2     2/2013  Yin et al.
(Continued)

FOREIGN PATENT DOCUMENTS

KR           10-1278972 B1     6/2013

*Primary Examiner* — Rudy Zervigon
(74) *Attorney, Agent, or Firm* — Muir Patent Law, PLLC

(57) ABSTRACT

An apparatus for manufacturing a semiconductor device includes a chamber including a lower housing and an upper housing, heater chucks in the lower housing, shower heads on the heater chucks, the shower heads being between the lower housing and the upper housing, power supplies connected to the shower heads to provide radio-frequency powers to the shower heads, power straps in the upper housing to connect the shower heads to the power supplies, and shielding members in the upper housing, the shielding members enclosing the power straps and the shower heads, respectively, the shielding members to prevent electromagnetic interference of the radio-frequency powers between the power straps and between the shower heads.

10 Claims, 6 Drawing Sheets

(58) Field of Classification Search
CPC ......... H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745
USPC .......... 118/719, 723 ER, 723 E; 156/345.31, 156/345.32, 345.43, 345.44, 345.45, 156/345.46, 345.47
See application file for complete search history.

(56) References Cited

U.S. PATENT DOCUMENTS

| | | | |
|---|---|---|---|
| 9,954,508 B2 | 4/2018 | Leeser et al. | |
| 10,145,010 B2 | 12/2018 | Kapoor et al. | |
| 10,187,032 B2 | 1/2019 | Kapoor et al. | |
| 10,658,159 B2 | 5/2020 | Shojaei et al. | |
| 2002/0088776 A1* | 7/2002 | Nakano | H05H 1/46 219/121.54 |
| 2003/0176074 A1* | 9/2003 | Paterson | H01J 37/32458 438/709 |
| 2009/0047774 A1* | 2/2009 | Yamazaki | C23C 16/509 438/479 |
| 2011/0212625 A1* | 9/2011 | Toyoda | C23C 16/4585 438/758 |
| 2015/0361553 A1* | 12/2015 | Murakawa | C23C 16/45561 156/345.55 |
| 2015/0380221 A1 | 12/2015 | Liu et al. | |
| 2019/0145005 A1* | 5/2019 | Outten | H01J 37/32422 427/569 |
| 2021/0159053 A1* | 5/2021 | Tong | H01J 37/32449 |

* cited by examiner

APPARATUS FOR AND METHOD OF MANUFACTURING SEMICONDUCTOR DEVICE

CROSS-REFERENCE TO RELATED APPLICATION

Korean Patent Application No. 10-2020-0155349, filed on Nov. 19, 2020 in the Korean Intellectual Property Office, and entitled: "Apparatus for and Method of Manufacturing Semiconductor Device," is incorporated by reference herein in its entirety.

BACKGROUND

1. Field

The present disclosure relates to an apparatus for and a method of manufacturing a semiconductor device. In particular, the present disclosure relates to an apparatus for forming a thin film on a substrate, and a method of manufacturing a semiconductor device.

2. Description of the Related Art

In general, a semiconductor device is manufactured by multiple processes. For example, the multiple processes may include a thin-film deposition process, a lithography process, an etching process, etc. For example, the thin-film deposition process and the etching process may be performed using plasma, which is used to treat a substrate at a predetermined temperature. For example, the plasma may be produced using a high frequency power.

SUMMARY

According to an embodiment, a method of manufacturing a semiconductor device may include placing a plurality of substrates in a chamber, supplying a reaction gas on the substrates, using shower heads, which are provided in the chamber, and providing radio-frequency powers to the shower heads, without an electromagnetic interference between the shower heads using shielding members, which are provided in the chamber and enclosing the shower heads. The chamber may include a lower housing, and an upper housing, which is provided on the lower housing and the shower heads, and in which power straps connected to the shower heads are introduced. The shielding members may include shower-head shielding members enclosing the shower heads respectively, and strap shielding members connected to the shower-head shielding members and enclosing the power straps, respectively.

According to an embodiment, an apparatus for manufacturing a semiconductor device may include a chamber including a lower housing and an upper housing on the lower housing, a plurality of heater chucks disposed in the lower housing, a plurality of shower heads provided on the heater chucks and between the lower and upper housings, a plurality of power supplying parts connected to the shower heads to provide radio-frequency powers to the shower heads, a plurality of power straps disposed in the upper housing to connect the shower heads to the power supplying parts, and a plurality of shielding members disposed in the upper housing and enclosing the power straps and the shower heads respectively to prevent electromagnetic interference of the radio-frequency powers between the power straps and between the shower heads.

According to an embodiment, a method of manufacturing a semiconductor device may include placing a plurality of substrates in a chamber, supplying a reaction gas on the substrates, using shower heads, which are provided in the chamber, and providing radio-frequency powers to the shower heads, without an electromagnetic interference issue between the shower heads using shielding members, which are provided in the chamber and enclosing the shower heads. The shielding members may include shower-head shielding members enclosing the shower heads respectively, and strap shielding members enclosing power straps connected to the shower heads, respectively.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
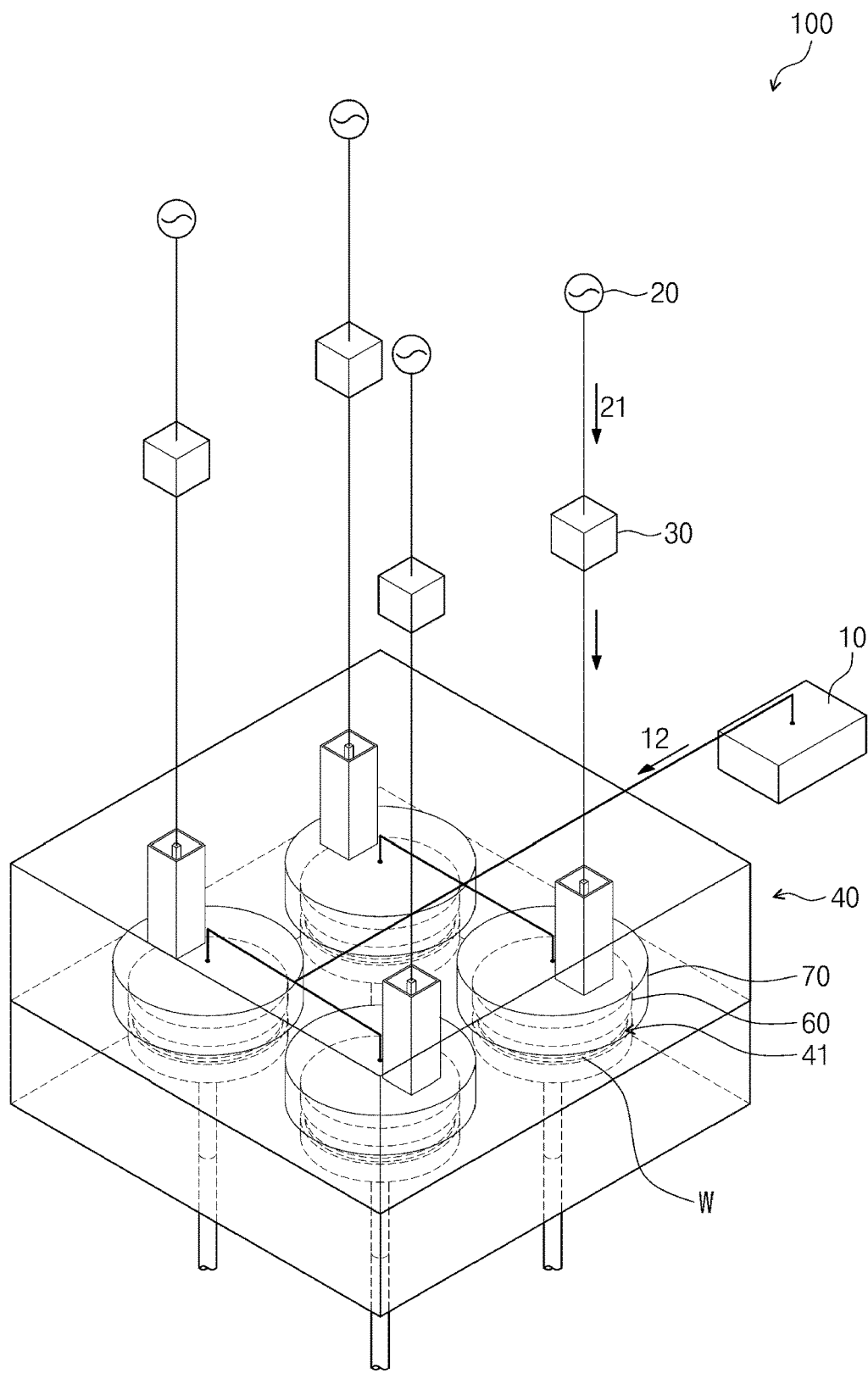
FIG. 1 illustrates a schematic view of an apparatus for manufacturing a semiconductor device, according to an example embodiment.
Figure 2:
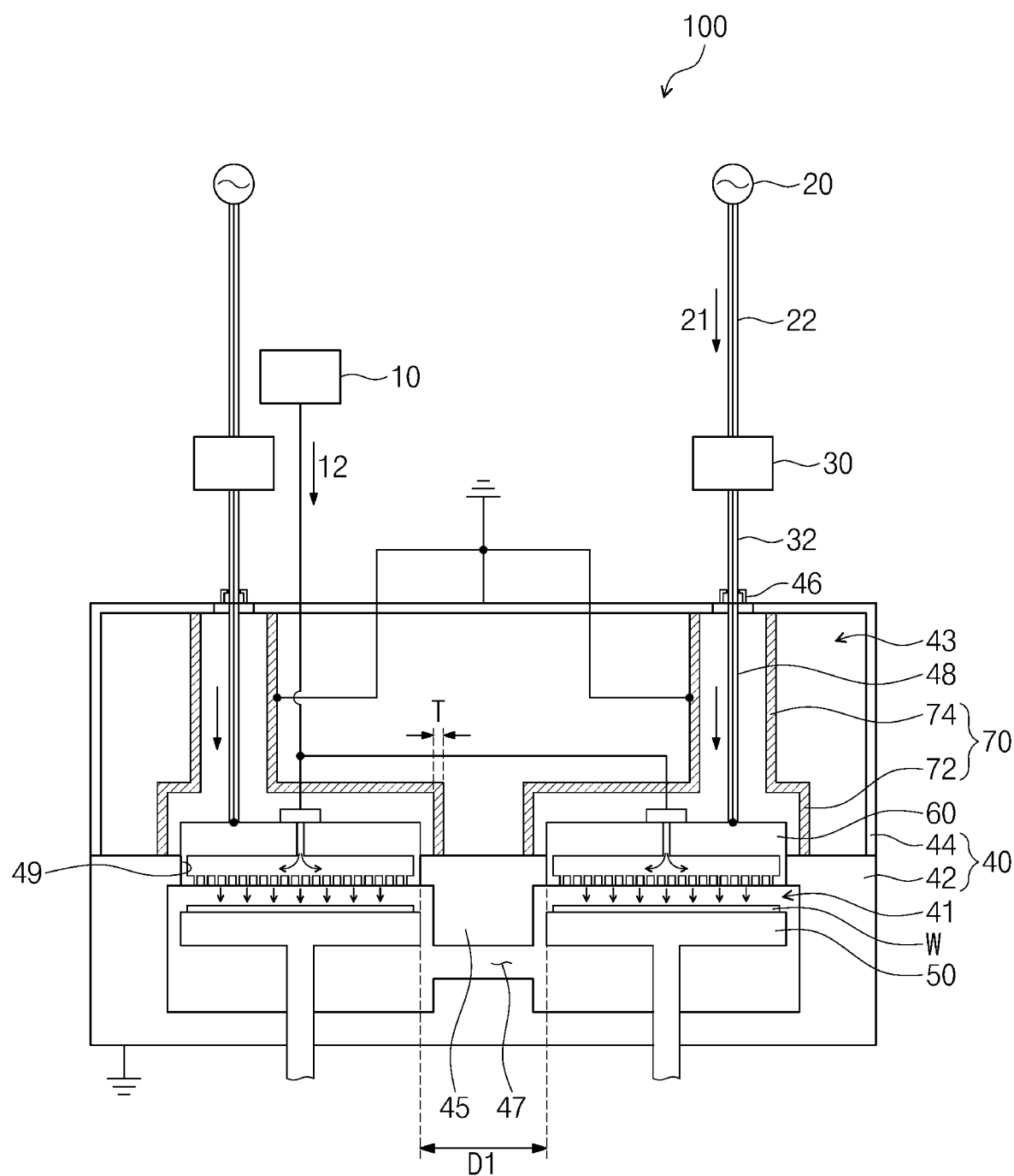
FIG. 2 is a cross-sectional view of the apparatus of FIG. 1.

FIG. 1 illustrates an example of an apparatus 100 for manufacturing a semiconductor device. FIG. 2 is a cross-sectional view of the apparatus 100.

Referring to FIGS. 1 and 2, the apparatus 100 may be a plasma-enhanced chemical vapor deposition (PECVD) apparatus. In an embodiment, the apparatus 100 may include a reaction gas supply 10, power supplies 20, matchers 30, and a chamber 40.

The reaction gas supply 10 may be connected to the chamber 40. The reaction gas supply 10 may be configured to supply a reaction gas 12 into the chamber 40. For example, the reaction gas 12 may include tetra ethyl orthosilicate (TEOS) and/or oxygen ($O_2$), and may be used to form a thin film (e.g., a silicon oxide ($SiO_2$) layer) on a substrate W. In another example, the reaction gas 12 may include silane ($SiH_4$) and/or ammonia ($NH_3$), and may be used to form a thin film (e.g., a silicon nitride (SiN) layer) on the substrate W.

The power supplies may be connected to the chamber 40. The power supplies 20 may provide radio-frequency (RF) powers 21 to the chamber 40. The RF powers 21 may be used to produce plasma from the reaction gas 12. The RF powers 21 may also be used to concentrate the reaction gas 12 to a region on the substrate W, and in this case, the resulting film may be formed to have an increased film density. The RF powers 21 may be also used to increase reactivity of the reaction gas 12 to increase the film density of the resulting film. Each of the RF powers 21 may have a frequency of about 27.12 MHz. Each of the RF powers 21 may have a power of about 1 KW to about 1000 KW.

The matchers 30 may be provided between and connected to the power supplies 20 and the chamber 40, e.g., each matcher 30 may be between the chamber 40 and a corresponding power supply 20. The matchers 30 may be respectively connected to the power supplies 20 through first cables 22. The matchers 30 may also be connected to the chamber 40 through second cables 32. Each of the first and second cables 22 and 32 may include a coaxial cable.

The matchers 30 may be configured to allow for impedance matching between the power supplies 20 and the chamber 40. The matchers 30 may be configured to remove a reflected fraction of the RF powers 21, which is fed-back from the chamber 40, and thus, it may be possible to prevent the power supplies 20 from being damaged, and to improve the supplying efficiency of the RF powers 21.

The chamber 40 may be configured to be able to load a plurality of substrates W therein. For example, the chamber 40 may be configured to load about four substrates W therein. The chamber 40 may provide a closed space, which is isolated from the outside, to the substrates W. In the chamber 40, a manufacturing process (e.g., a chemical vapor deposition process) using the reaction gas 12 and the RF power 21 may be performed on the substrates W. The chamber 40 may be grounded. The chamber 40 may be connected to a vacuum pump. For example, the chamber 40 may have a low pressure of about $1 \times 10^{-3}$ Torr to about $1 \times 10^{-6}$ Torr by a pumping operation of the vacuum pump, during the manufacturing process.

In detail, referring to FIG. 2, the chamber 40 may include a lower housing 42 and an upper housing 44. The upper housing 44 may be stacked on top of the lower housing 42.

For example, as illustrated in FIG. 2, the lower housing 42 may have a quadrangular shape, and process zones 41 may be formed therein, e.g., four process zones 41 may be arranged in a matrix pattern within the lower housing 42 (FIG. 1). For example, each of the process zones 41 may be an opening, e.g., cavity, within the lower housing 42 to provide a region for processing the substrate W, i.e., each substrate W may be processed in a corresponding process zone 41 of the lower housing 42. For example, the processing on the substrates W may include a thin-film deposition process, e.g., a PECVD process, an atomic layer deposition (ALD) process, etc. The process zones 41 may be separated from each other by a partition wall 45, which is provided in the lower housing 42. In other words, the partition wall 45 may be provided between the process zones 41, e.g., the partition wall 45 may separate every two adjacent process zones 41. The partition wall 45 may have a hole 47, e.g., the hole 47 may connect two adjacent process zones 41 through the partition wall 45 to provide fluid communication therebetween.

As further illustrated in FIG. 2, heater chucks 50 may be provided in the lower housing 42, respectively. For example, a heater chuck 50 may be positioned in each process zone 41, so one substrate W may be positioned above one heater chuck 50. When the substrates W are disposed in the chamber 40, the substrates W may be loaded onto the heater chucks 50. The heater chucks 50 may be moveable in a vertical direction within the respective process zones 41, so the heater chucks 50 may be lifted up to a level higher than the holes 47, e.g., the heater chucks 50 may be positioned above the holes 47 during processing. For example, during processing, the heater chucks 50 may be configured to heat the substrates W to a temperature of about 100° C. to about 650° C. The reaction gas 12 may be provided onto the substrates W to form thin films, respectively. If a process of forming the thin films is finished, the heater chucks 50 may be lowered to a level lower than the holes 47 of the partition wall 45. If the lowering of the heater chucks 50 is finished, the substrates W may be transferred from one of the heater chucks 50 to another of the heater chucks 50 through the hole 47 of the partition wall 45. Alternatively, the substrates W may be unloaded to the outside of the chamber 40 through a slit valve, e.g., which may be formed in a sidewall of the chamber 40.

Shower heads 60 may be provided on the heater chucks 50, respectively. The shower heads 60 may be provided in upper cavities 49 of the lower housing 42 to hermetically seal upper portions of the process zones 41, e.g., a width of each shower head 60 may equal a width of a corresponding cavity 49 to completely fit in and seal the cavity 49. The shower heads 60 may be connected to the reaction gas supply 10 and the matchers 30, so the shower heads 60 may be configured to uniformly supply the reaction gas 12 onto the substrates W. The shower heads 60 may produce plasma from the reaction gas 12 in the process zones 41, using the RF powers 21. The shower heads 60 may be spaced apart from each other by a horizontal distance D1, e.g., a distance of about 10 cm.

The upper housing 44 may be disposed on the lower housing 42 and the shower heads 60. The shower heads 60 may be provided between the upper housing 44 and the lower housing 42. For example, as illustrated in FIG. 2, top portions of the shower heads 60 may extend above the lower housing 42, so bottom portions of the shower heads 60 may be within the cavities 49 of the lower housing 42, and the top portions of the shower heads 60 extend into the upper housing 44.

The upper housing 44 may be grounded. The upper housing 44 may define a maintenance zone 43 on the process zones 41 of the lower housing 42. The maintenance zone 43 may be a zone configured to protect the shower heads 60 and/or is used to construct joint of lines. In an example embodiment, the upper housing 44 may have sockets 46. The sockets 46 may be provided on the maintenance zone 43. The sockets 46 may be connected to the matchers 30 through the second cables 32, respectively.

Power straps 48 may be provided in the upper housing 44. The power straps 48 may be introduced in the upper housing 44 to connect the sockets 46 to the shower heads 60. Each of the power straps 48 may include a power strap and/or a power rod. The power straps 48 may be used to provide the RF powers 21 to the shower heads 60.

Shielding members 70 may be provided on the power straps 48 and the shower heads 60. The shielding members 70 may be provided to enclose the shower heads 60 and the power straps 48. The shielding members 70 may be grounded. The shielding members 70 may prevent or suppress electromagnetic interference (e.g., parasitic capacitance or noise) between adjacent ones of the shower heads 60, and thus, it may be possible to improve deposition uniformity between the process zones 41. In addition, the shielding members 70 may prevent the power straps 48 from electromagnetically interfering with each other. In an example embodiment, the shielding members 70 may be formed of or include at least one metallic material (e.g., iron (Fe) or copper (Cu)).

Figure 3:
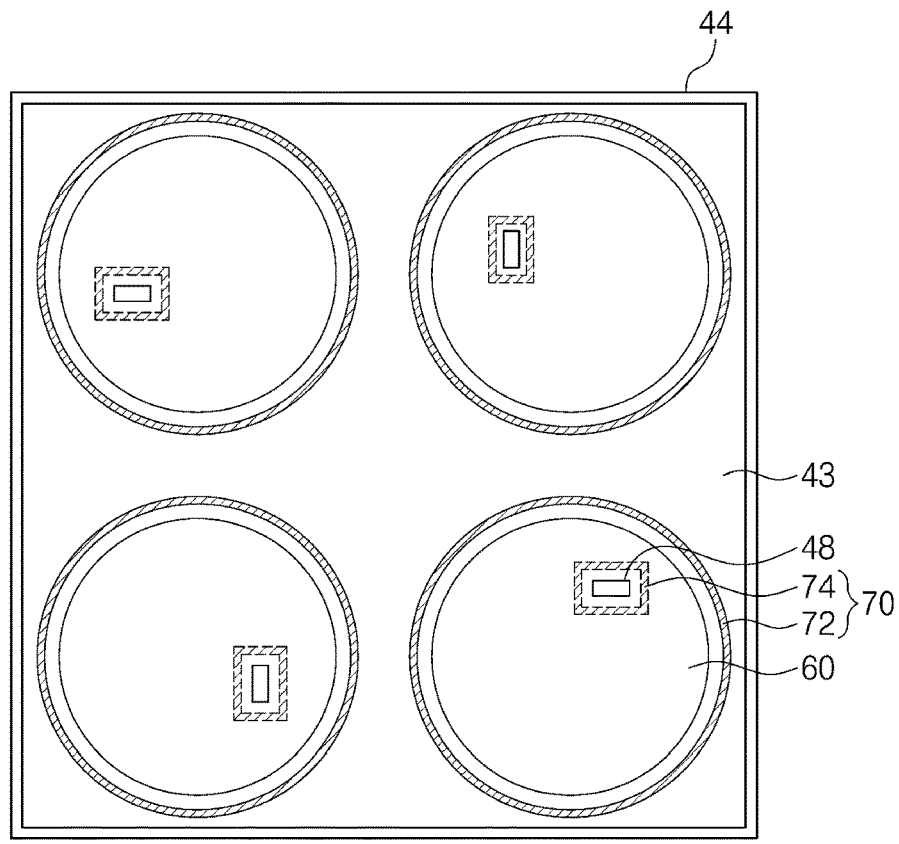
FIG. 3 is a plan view of an example of shielding members of FIG. 2.

FIG. 3 illustrates a top view of the shielding members 70 of FIG. 2.

Referring to FIGS. 2 and 3, the shielding members 70 may include shower-head shielding members 72 and strap shielding members 74. For example, as illustrated in FIG. 2, each shielding member 70 may include a shower-head shielding member 72 covering the top portion of the shower head 60 in the upper housing 44, and a strap shielding member 74 extending upward from the shower-head shielding member 72 to cover a corresponding strap 48. For example, as illustrated in FIG. 2, the shower-head shielding member 72 and the strap shielding member 74 are integral with each other.

In detail, the shower-head shielding members 72 may cover top surfaces of the shower heads 60 in the upper housing 44, e.g., the shower-head shielding members 72 may contact a top surface of the lower housing 42 to completely surround, e.g., overlap, the top and side surfaces of corresponding top portions of the shower heads 60 in the upper housing 44. The shower heads 60 and the shower-head shielding members 72 may be respectively disposed at four different positions corresponding to four vertices of a rectangle. The shower-head shielding members 72 may be spaced apart from each other. The shower-head shielding members 72 may be grounded to prevent the electromagnetic interference between the shower heads 60. In an embodiment, the shower-head shielding members 72 may have a cap shape and/or a cover shape, when viewed in a vertical section. In addition, the shower-head shielding members 72 may have a circular ring shape, when viewed in a plan view.

The strap shielding members 74 may be disposed on an outer circumference surface of the power strap 48, e.g., interiors of the strap shielding members 74 may be in fluid communication with interiors of shower-head shielding members 72. The strap shielding members 74 may be connected to the shower-head shielding members 72, The strap shielding members 74 may be connected to the shower-head shielding members 72. The strap shielding members 74 may be grounded. The strap shielding members 74 may prevent or suppress electromagnetic interference between the power straps 48. Each of the power straps 48 may have a rectangular shape, when viewed in a plan view. When the power strap 48 has a rectangular shape in a planar view, the strap shielding members 74 may be shaped like a rectangular and circular ring. For example, the strap shielding members 74 may have a rectangular pipe shape or a circular pipe shape.

Figure 4:
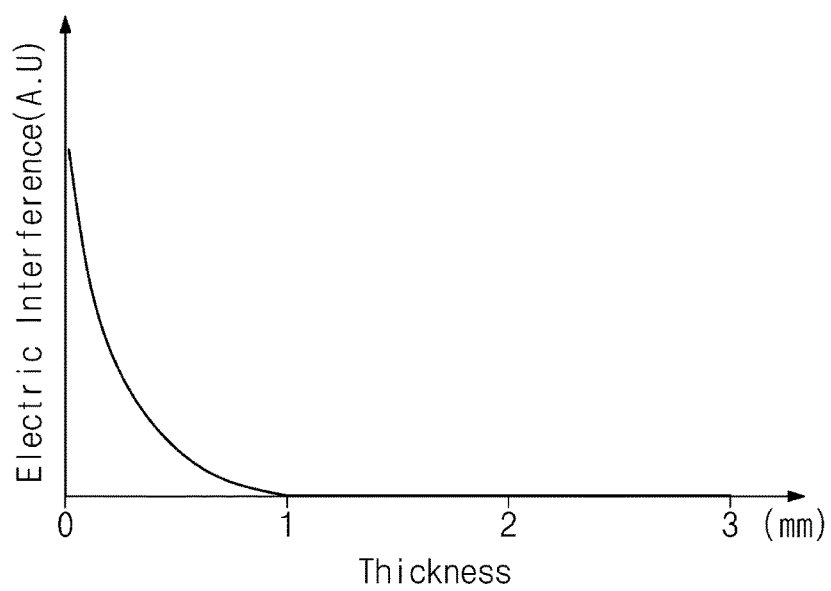
FIG. 4 is a graph showing a strength of electromagnetic interference versus a thickness of the shielding members of FIG. 2.

FIG. 4 is a graph showing a strength of electromagnetic interference versus a thickness T of the shielding members 70 of FIG. 2.

Referring to FIG. 4, the electromagnetic interference may be reduced to the minimum value, when the shielding members 70 have a thickness T of 1 mm or larger. In the case where the thickness T of the shielding members 70 is reduced to a value of 1 mm or smaller, the electromagnetic interference may increase in an inversely proportional manner with respect to the thickness T.

Referring back to FIG. 2, the thickness T of the shielding members 70 may be smaller than half of the distance D1 between the shower heads 60. For example, in the case where the distance D1 between the shower heads 60 is about 10 cm, the thickness T of the shielding members 70 may be smaller than about 5 cm.

Figure 5:
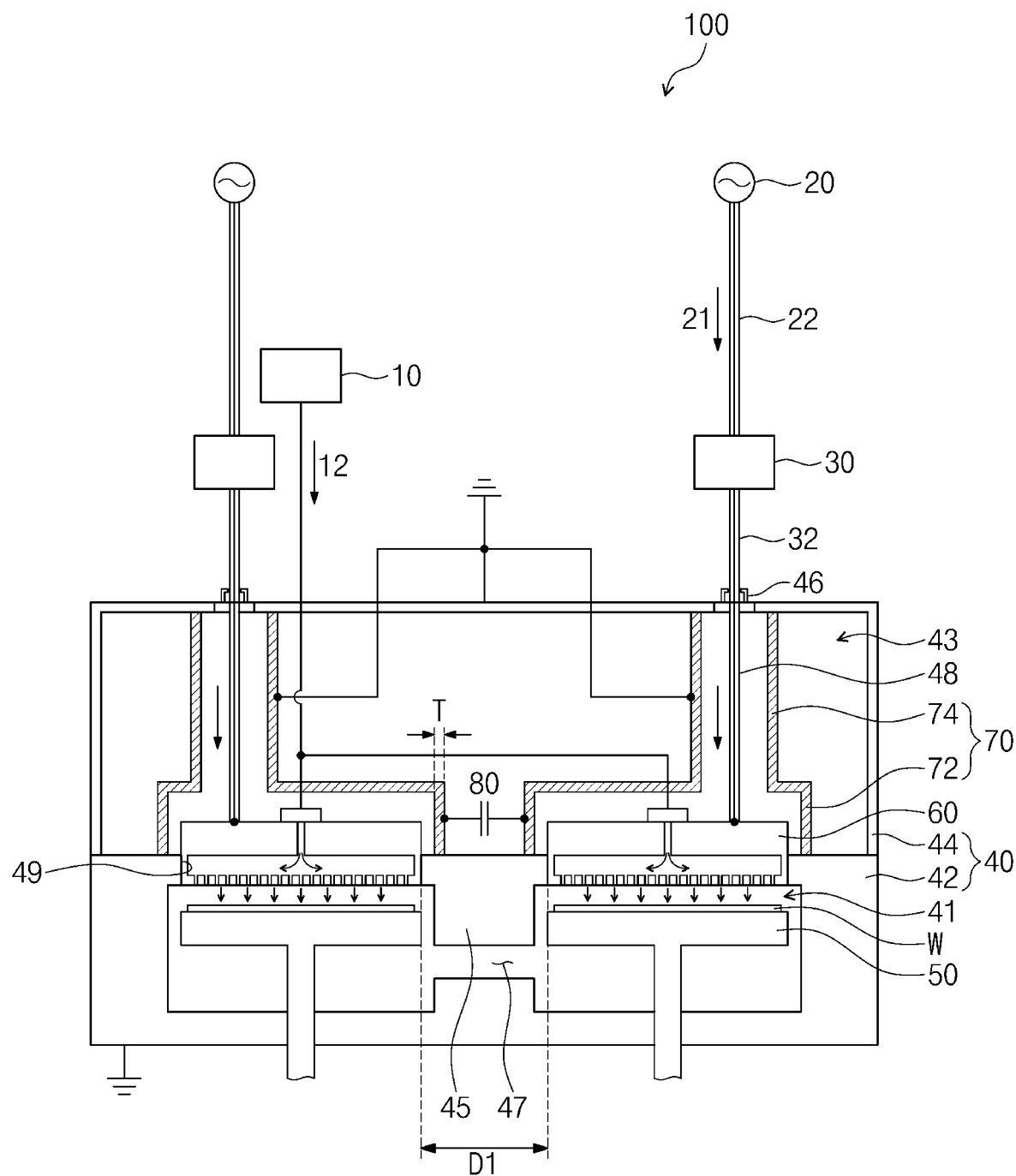
FIG. 5 is a cross-sectional view of the shielding members of FIG. 2 and a capacitor between the shielding members.
Figure 6:
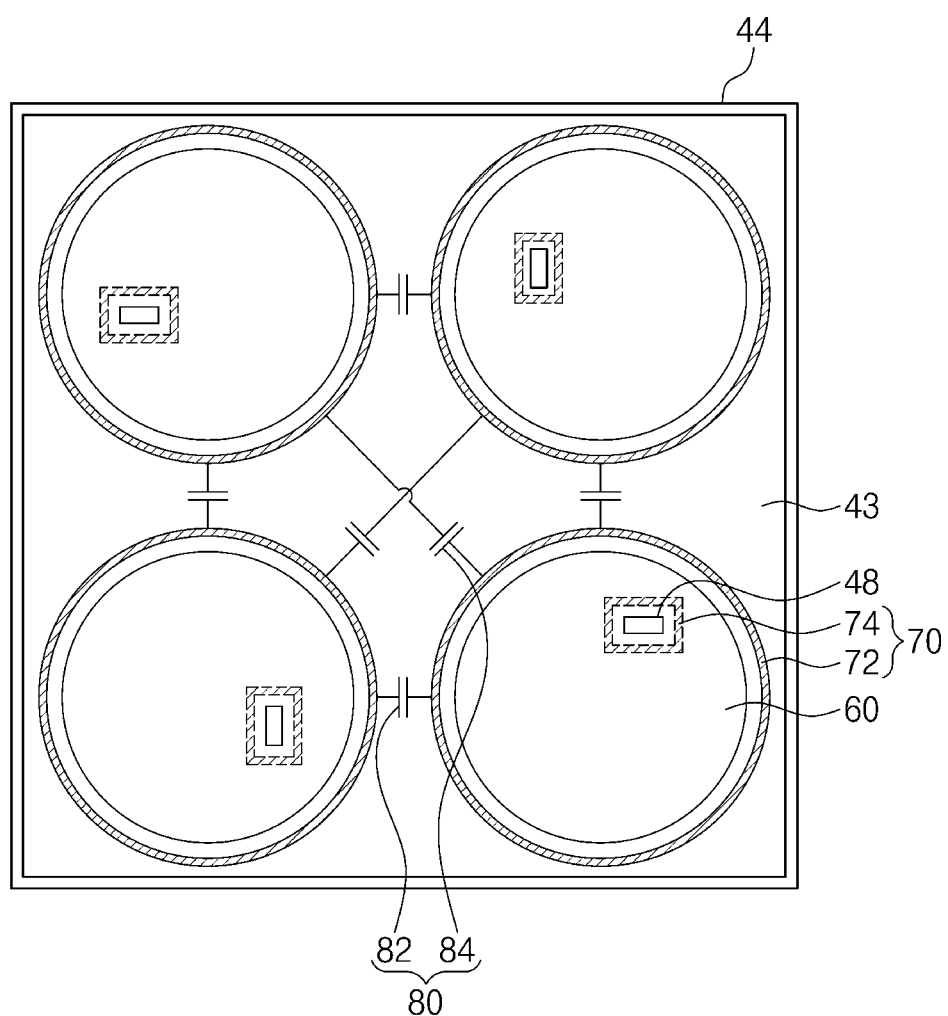
FIG. 6 is a plan view of an example of a capacitor of FIG. 5.

FIG. 5 illustrates the shielding members 70 of FIG. 2 and a capacitor 80 between the shielding members 70. FIG. 6 illustrates an example of the capacitor 80 of FIG. 5.

Referring to FIGS. 5 and 6, the apparatus 100 may further include the capacitors 80. The capacitors 80 may be connected to the shower-head shielding members 72. The capacitors 80 may additionally prevent or suppress a high frequency (e.g., RF) interference between the shower-head shielding members 72. The reaction gas supply 10, the power supplies 20, the matchers 30, the chamber 40, the heater chucks 50, the shower heads 60, and the shielding members 70 may be configured to have substantially the same features as those in FIG. 2.

Referring to FIG. 6, the capacitors 80 may include short range capacitors 82 and long range capacitors 84. Each of the short range capacitors 82, e.g., near field capacitors, may be connected to a pair of the shower-head shielding members 72 which are adjacent to each other, e.g., along a horizontal direction in a top view. In the case where the shower-head shielding members 72 are disposed at positions corresponding to vertices of a rectangle, the short range capacitors 82 may be formed along lines and/or sides of the rectangle. For example, the short range capacitors 82 may have capacitance ranging from about 100 g to about 1 mF.

The long range capacitors 84, e.g., far field capacitors, may be provided between the short range capacitors 82, e.g., along a diagonal direction in a top view. In the case where the shower-head shielding members 72 are placed at positions corresponding to vertices of a rectangle, the long range capacitors 84 may be provided between and connected to the shower-head shielding members 72, which are spaced apart from each other in a diagonal direction of the rectangle. The long range capacitors 84 may have capacitance that is smaller than the capacitance of the short range capacitors 82. For example, the long range capacitors 84 may have capacitance ranging from about 10 g to about 100 g.

The shower heads 60, the power straps 48, and the strap shielding members 74 may be configured to have substantially the same features as those in FIG. 3.

Hereinafter, a method of manufacturing a semiconductor device using the afore-described apparatus 100 will be described in more detail.

Figure 7:
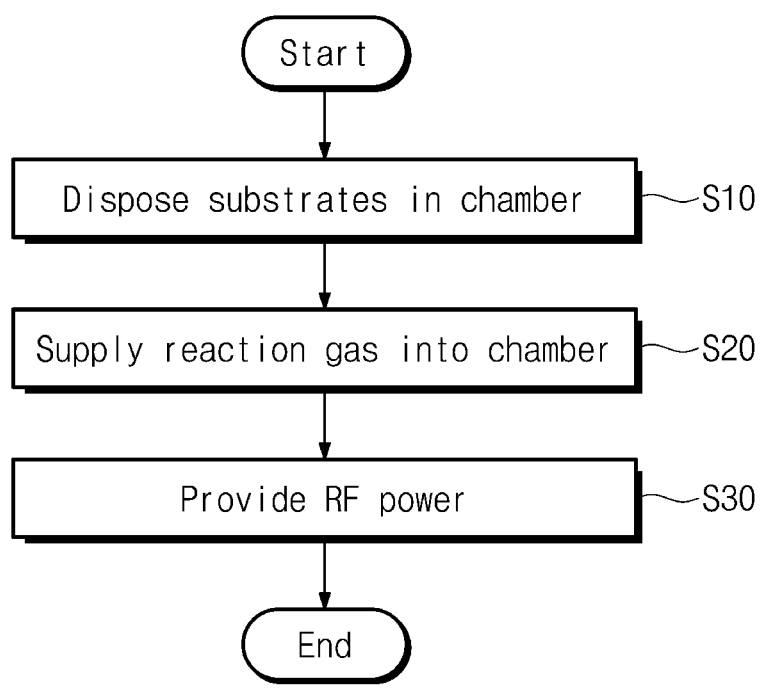
FIG. 7 is a flow chart of a method of manufacturing a semiconductor device, according to an example embodiment.

FIG. 7 illustrates a method of manufacturing a semiconductor device, according to an example embodiment.

Referring to FIGS. 1, 2, and 7, the substrates W may be disposed in the chamber 40, e.g., using a robot arm (S10). The substrates W may be loaded on the heater chucks 50.

Next, the reaction gas supply 10 may be used to supply the reaction gas 12 into the chamber 40 (S20). The shower heads 60 may provide the reaction gas 12 onto the substrates W. The reaction gas 12 provided onto the substrates W may be used to form thin films (e.g., a silicon oxide layer or a silicon nitride layer) on the substrates W.

Furthermore, the power supplies 20 may provide the RF powers 21 to the shower heads 60, without electromagnetic interference therebetween, using the shielding members 70 (S30). The shower heads 60 may excite the reaction gas 12 to a plasma state using the RF powers 21, and then may provide the reaction gas 12 of the plasma state to a region on the substrates W. The RF powers 21 may concentrate the reaction gas 12 of the plasma state in a region on the substrate W, and this may make it possible to increase a film density of the resulting films. In addition, the RF powers 21 may increase reactivity of the reaction gas 12 and thereby further increase the film density of the thin film. The shower-head shielding members 72 may cover the top and side surfaces of the shower heads 60, and in this case, it may be possible to prevent or suppress electromagnetic interference between the shower heads 60, when the RF powers 21 are applied to the shower heads 60. The strap shielding members 74 may be provided to enclose the power straps 48. The strap shielding members 74 may prevent or suppress electromagnetic interference (e.g., parasitic capacitance or noise) between the power straps 48.

By way of summation and review, an example embodiment provides an apparatus, which is configured to prevent an electromagnetic interference between shower heads in a process of manufacturing a semiconductor device, and a method of manufacturing a semiconductor device. That is, in an apparatus for manufacturing a semiconductor device according to an example embodiment, shielding members may be provided to enclose shower heads, respectively, thereby preventing the shower heads from electromagnetically interfering with each other.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for manufacturing a semiconductor device, the apparatus comprising:
    a chamber including a lower housing and an upper housing on the lower housing;
    heater chucks in the lower housing;
    shower heads on the heater chucks, the shower heads being between the lower housing and the upper housing;
    power supplies connected to the shower heads, the power supplies to provide radio-frequency powers to the shower heads;
    power straps in the upper housing, the power straps connecting the shower heads to the power supplies; and
    shielding members in the upper housing, the shielding members enclosing the power straps and the shower heads, respectively, the shielding members to prevent electromagnetic interference of the radio-frequency powers between the power straps and between the shower heads,
    wherein the shielding members are connected to each other by capacitors
    wherein the capacitors comprise:
    short range capacitors connected between the shielding members that are disposed in short range distance to remove or minimize a near field interference between the shielding members, and
    long range capacitors connected between the shielding members that are disposed in long range distance longer than the short range distance to remove or minimize a far field interference between the shielding members.

2. The apparatus as claimed in claim 1,
    wherein the shielding members include:
    shower-head shielding members enclosing the shower heads, respectively; and
    strap shielding members enclosing the power straps, respectively.

3. The apparatus as claimed in claim 2,
    wherein the shower-head shielding members have a cap shape or a cover shape.

4. The apparatus as claimed in claim 2,
    wherein the strap shielding members have a rectangular pipe shape.

5. The apparatus as claimed in claim 2,
    wherein the shower-head shielding members have a circular ring-shaped cross-section, in a top view, and the strap shielding members have a rectangular cross-section, in the top view.

6. The apparatus as claimed in claim 2,
    wherein the shower-head shielding members are connected to each other by the capacitors.

7. The apparatus as claimed in claim 1,
    wherein the shielding members include copper or iron.

8. The apparatus as claimed in claim 1,
    wherein each of the shielding members has a thickness of 1 mm or larger.

9. The apparatus as claimed in claim 8,
    wherein the thickness of each of the shielding members is smaller than 5 cm.

10. The apparatus as claimed in claim 1,
    wherein the shielding members are grounded.

* * * * *